United States Patent
Lee et al.

(10) Patent No.: US 11,970,763 B2
(45) Date of Patent: Apr. 30, 2024

(54) HYBRID-TYPE MASK STICK AND MASK FRAME ASSEMBLY ADOPTING THE SAME

(71) Applicant: Samsung Display Co., Ltd., Yongin-si (KR)

(72) Inventors: Suhwan Lee, Yongin-si (KR); Jaesoo Ha, Yongin-si (KR); Kwangtae Yu, Yongin-si (KR); Jinbaek Choi, Yongin-si (KR); Sangwoo Pyo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 204 days.

(21) Appl. No.: 16/454,183

(22) Filed: Jun. 27, 2019

(65) Prior Publication Data

US 2020/0123644 A1    Apr. 23, 2020

(30) Foreign Application Priority Data

Oct. 18, 2018    (KR) .................... 10-2018-0124578

(51) Int. Cl.
*C23C 14/04*    (2006.01)
*C23C 16/04*    (2006.01)
*H10K 71/16*    (2023.01)

(52) U.S. Cl.
CPC .......... *C23C 14/042* (2013.01); *C23C 14/044* (2013.01); *C23C 16/042* (2013.01); *H10K 71/164* (2023.02); *H10K 71/166* (2023.02)

(58) Field of Classification Search
CPC ......... C23C 14/04; C23C 14/042; C23C 8/04; C23C 10/04; C23C 14/044; C23C 16/04;
(Continued)

(56) References Cited

U.S. PATENT DOCUMENTS 3,323,490 A * 6/1967 McGilliard ........... C23C 14/042
                                                    118/504
6,749,690 B2 * 6/2004 Clark .................... H01L 21/682
                                                    118/721
(Continued)

FOREIGN PATENT DOCUMENTS

CN    105826469 A    8/2016
CN    205420527 U    8/2016
(Continued)

OTHER PUBLICATIONS

Chinese Office Action corresponding to Application No. 201910892103.6 dated Dec. 13, 2022, 9 pages.

*Primary Examiner* — Aiden Lee
(74) *Attorney, Agent, or Firm* — Innovation Counsel LLP

(57) ABSTRACT

Provided are a hybrid-type mask stick and a mask frame assembly adopting the same. The mask frame assembly includes a mask frame; and a mask stick including a first mask stick extending in a first direction, a second mask stick extending in a second direction crossing the first direction, and a plurality of third mask sticks connected to the first mask stick and the second mask stick, the at least one first mask stick, the at least one second mask stick and the plurality of third mask sticks defining a plurality of deposition areas, wherein the first mask stick includes a first stick and a second stick arranged on the first stick, and at least one of the first stick and the second stick includes a partially-recessed portion in which the first mask stick is connected to the second mask stick.

12 Claims, 11 Drawing Sheets

(58) Field of Classification Search
CPC .... C23C 16/042; C23C 18/06; H10K 71/166; C30B 25/04
See application file for complete search history.

(56) References Cited

U.S. PATENT DOCUMENTS

| | | | |
|---|---|---|---|
| 7,033,665 | B2 | 4/2006 | Yotsuya et al. |
| 8,186,299 | B2 | 5/2012 | Kim |
| 9,121,095 | B2 | 9/2015 | Lee et al. |
| 9,847,485 | B2 | 12/2017 | Min |
| 10,388,873 | B2 | 8/2019 | Chang |
| 2007/0178708 | A1 | 8/2007 | Ukigaya |
| 2008/0118743 | A1* | 5/2008 | Lee .................. H01L 51/56 428/332 |
| 2011/0146573 | A1* | 6/2011 | Park .................. C23C 14/042 118/712 |
| 2011/0165327 | A1 | 7/2011 | Park et al. |
| 2012/0299016 | A1 | 11/2012 | Choi |
| 2015/0101536 | A1 | 4/2015 | Han |
| 2015/0159267 | A1 | 6/2015 | Ochi et al. |
| 2016/0079532 | A1* | 3/2016 | Yi .................. H01L 51/0002 438/758 |
| 2017/0141313 | A1* | 5/2017 | Min .................. C23C 14/042 |

FOREIGN PATENT DOCUMENTS

| | | |
|---|---|---|
| CN | 107435130 A | 12/2017 |
| CN | 107815642 A | 3/2018 |
| KR | 10-0645606 B1 | 11/2006 |
| KR | 10-2008-0045886 A | 5/2008 |
| KR | 10-2009-0093161 A | 9/2009 |
| KR | 10-2010-0133679 A | 12/2010 |
| KR | 10-1084184 B1 | 11/2011 |
| KR | 10-2012-0131548 A | 12/2012 |
| KR | 10-2015-0036334 A | 4/2015 |
| KR | 10-2015-0042600 A | 4/2015 |
| KR | 10-2015-0071321 A | 6/2015 |
| KR | 10-2017-0056769 A | 5/2017 |

* cited by examiner

HYBRID-TYPE MASK STICK AND MASK FRAME ASSEMBLY ADOPTING THE SAME

CROSS-REFERENCE TO RELATED APPLICATION

This application claims the benefit of Korean Patent Application No. 10-2018-0124578, filed on Oct. 18, 2018, in the Korean Intellectual Property Office, the disclosure of which is incorporated herein in its entirety by reference.

BACKGROUND

1. Field

One or more embodiments relate to a hybrid-type mask stick, and more particularly, to a mask frame assembly adopting the same.

2. Description of the Related Art

Generally, a display device may be used in a mobile apparatus such as a smartphone, a laptop computer, a digital camera, a camcorder, a personal digital assistant, a notebook computer, or a tablet personal computer, or an electronic apparatus such as a desktop computer, a television, an outdoor billboard, a display device for exhibitions, a vehicle dashboard, or a head-up display (HUD).

Various methods are used to form a thin film on a substrate of a display device. Among these methods, a deposition method is performed by depositing a deposition material onto the substrate by using a mask. A mask includes a pattern mask in which a plurality of pattern holes are arranged, or an open mask that does not require a plurality of pattern holes. Instead of the plurality of pattern holes, the open mask includes an opening for depositing a common layer.

For manufacturing convenience, a large open mask is used to simultaneously manufacture various sizes of display devices. The open mask is welded to a mask frame by applying a predetermined tensile force to the open mask.

SUMMARY

However, when a predetermined tensile force is applied to an open mask including a plurality of mask sticks, a mask stick may be deformed in a portion in which the plurality of mask sticks are connected to each other.

One or more embodiments include a hybrid-type mask stick for preventing deformation of a mask stick in the portion in which a plurality of mask sticks are connected to each other, and a mask frame assembly adopting the hybrid-type mask stick.

Additional aspects will be set forth in part in the description which follows and, in part, will be apparent from the description, or may be learned by practice of the presented embodiments.

According to one or more embodiments, a mask frame assembly includes a mask frame including an opening; and a mask stick arranged on the mask frame and including at least one first mask stick extending in a first direction, at least one second mask stick extending in a second direction crossing the first direction, and a plurality of third mask sticks connected to an end of each of the at least one first mask stick and the at least one second mask stick, the at least one first mask stick, the at least one second mask stick and the plurality of third mask sticks defining a plurality of deposition areas, wherein the at least one first mask stick includes a first stick and a second stick arranged on the first stick, and at least one of the first stick and the second stick includes a partially-recessed portion in which the at least one first mask stick is connected to the at least one second mask stick.

The first stick and the second stick may extend together in the first direction and overlap each other.

A thickness of the first stick may be greater than a thickness of the second stick.

The partially-recessed portion may be provided in the first stick and the at least one second mask stick may be mounted in the partially-recessed portion.

A depth of the partially-recessed portion may be the same as a thickness of the at least one second mask stick, and a surface of the first stick may be on a same horizontal plane as that of a surface of the at least one second mask stick mounted in the partially-recessed portion.

The at least one second mask stick may be welded to the at least one first mask stick while applying a tensile force.

A width of the second stick may be less than a width of the first stick.

The partially-recessed portion may include a first partially-recessed portion provided in the first stick and extending in the first direction; and a second partially-recessed portion provided in both the first stick and the second stick and extending in the second direction, and wherein the second stick is mounted in the first partially-recessed portion, and the at least one second mask stick is mounted in the second partially-recessed portion.

A depth of the first partially-recessed portion may be the same as the thickness of the second stick, a depth of the second partially-recessed portion may be the same as a thickness of the at least one second mask stick, and a surface of the first stick, a surface of the second stick, and a surface of a second mask stick may be on a same horizontal plane.

The at least one second mask stick may be welded onto the second stick while applying a tensile force.

The partially-recessed portion may include a first partially-recessed portion provided in the second stick, a second partially-recessed portion may be provided in the at least one second mask stick, wherein the second partially-recessed portion has a shape corresponding to the first partially-recessed portion, and the first partially-recessed portion may be combined with the second partially-recessed portion.

A total thickness of a portion in which the first partially-recessed portion is connected to the second partially-recessed portion may be the same as a thickness of the other portion of the second stick.

The at least one second mask stick may be welded onto the first stick while applying a tensile force, and the second stick may be welded onto the at least one second mask stick while applying a tensile force.

Both ends of the at least one first mask stick may be each connected to respective one of the plurality of third mask sticks, a first end of the at least one second mask stick may be connected to the at least one first mask stick, and a second end of the at least one second mask stick may be connected to respective one of the plurality of third mask sticks.

Each of the plurality of deposition areas may be each arranged in a space defined by the at least one first mask stick, the at least one second mask stick, and the plurality of third mask sticks connected to each other, and one deposition area among the plurality of deposition areas may correspond to an opening for a common layer deposited over an adjacent pixel area patterned on a unit display panel.

According to one or more embodiments, a hybrid-type mask stick includes at least one first mask stick extending in a first direction; at least one second mask stick extending in a second direction crossing the first direction; and a plurality of third mask sticks connected to respective ends of the at least one first mask stick and the at least one second mask stick, wherein the at least one first mask stick, the at least one second mask stick, and the plurality of third mask sticks are connected to each other to thereby define a plurality of deposition areas corresponding to each of a plurality of unit display panels, the at least one first mask stick includes a first stick and a second stick arranged on the first stick, and at least one of the first stick and the second stick includes a partially-recessed portion in which the at least one first mask stick is connected to the at least one second mask stick.

The first stick and the second stick may extend together in the first direction and overlap each other, and a thickness of the first stick is greater than a thickness of the second stick.

The partially-recessed portion may be provided in the first stick and the at least one second mask stick may be mounted in the partially-recessed portion.

A width of the at least one second mask stick may be less than a width of the first stick, and the partially-recessed portion may include a first partially-recessed portion provided in the first stick and extending in the first direction and a second partially-recessed portion provided in both the first stick and the second stick and extending in the second direction, wherein the second stick is mounted in the first partially-recessed portion, and the at least one second mask stick is mounted in the second partially-recessed portion.

The partially-recessed portion may include a first partially-recessed portion provided in the second stick and a second partially-recessed portion provided in the at least one second mask stick, wherein the second partially-recessed portion has a shape corresponding to the first partially-recessed portion and the first partially-recessed portion may be combined with the second partially-recessed portion.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
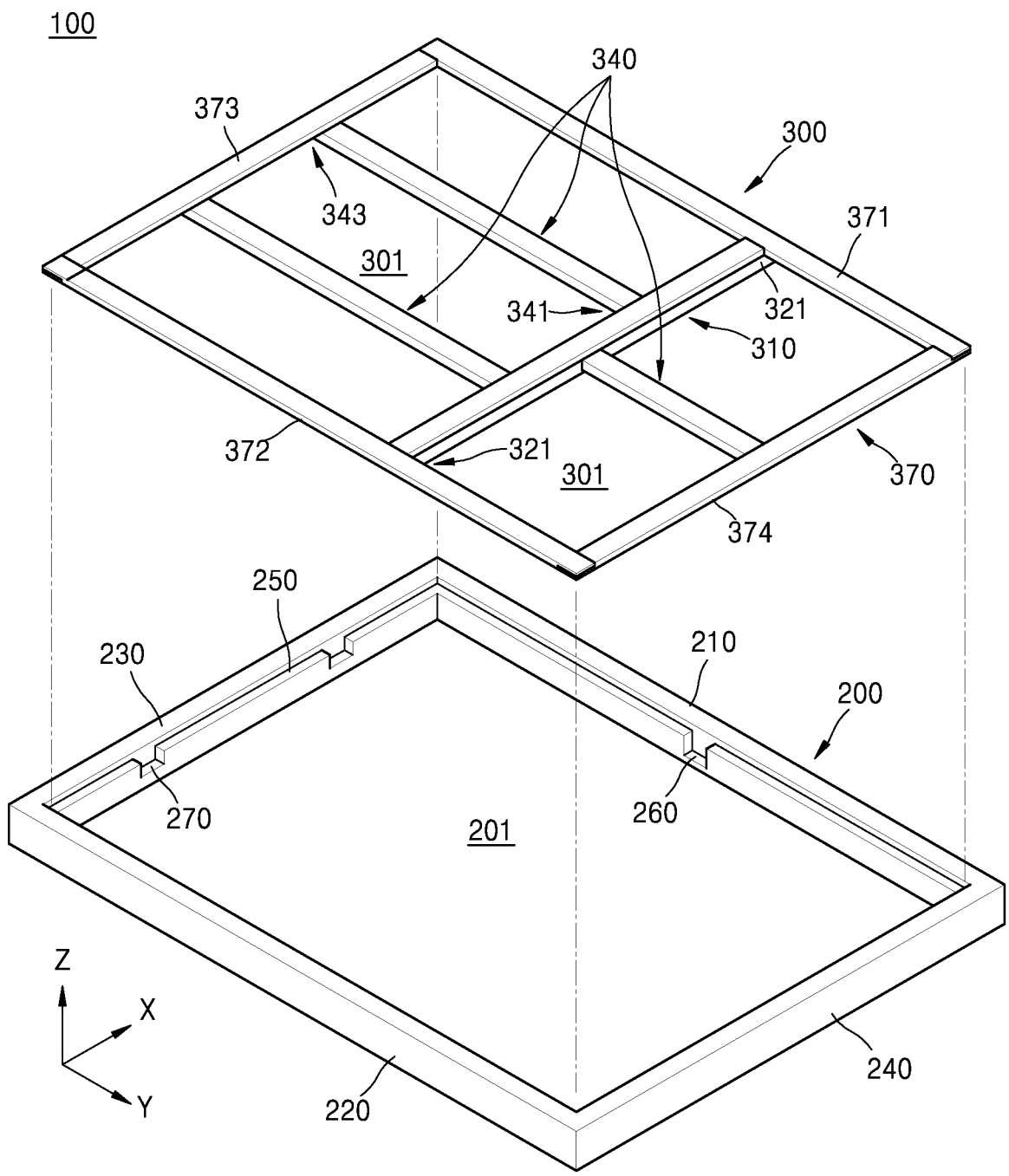
FIG. 1 is an exploded perspective view of a mask frame assembly according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As the present disclosure allows for various changes and numerous embodiments, particular embodiments will be illustrated in the drawings and described in detail in the written description. Effects and features of the present disclosure and a method of achieving the same will become apparent to those skilled in the art from the following detailed description which discloses various embodiments in conjunction with the annexed drawings. The present disclosure may, however, be embodied in many different forms and should not be construed as being limited to the embodiments set forth herein, It will be understood that when a component, such as a layer, a film, region, or a plate is referred to as being "on," another component, the component can be directly on the other component or intervening components may be present. In addition, sizes of components in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Hereinafter, according to the present disclosure, embodiments of a hybrid-type mask stick and a mask frame assembly adopting the same will be described in detail with reference to the accompanying drawings. Like reference numerals in the drawings denote like elements, and thus their description will be omitted.

Figure 2:
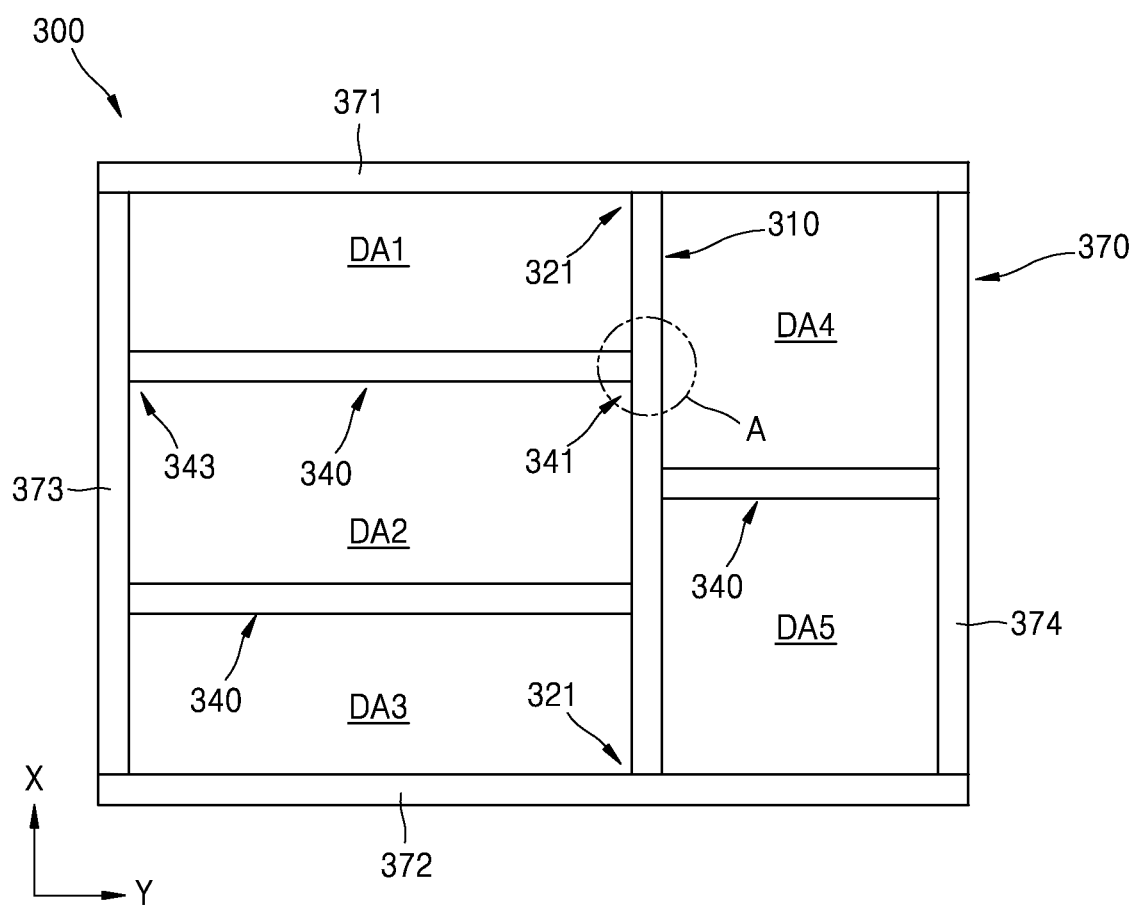
FIG. 2 is a plan view of a mask stick of FIG. 1.
Figure 3A:
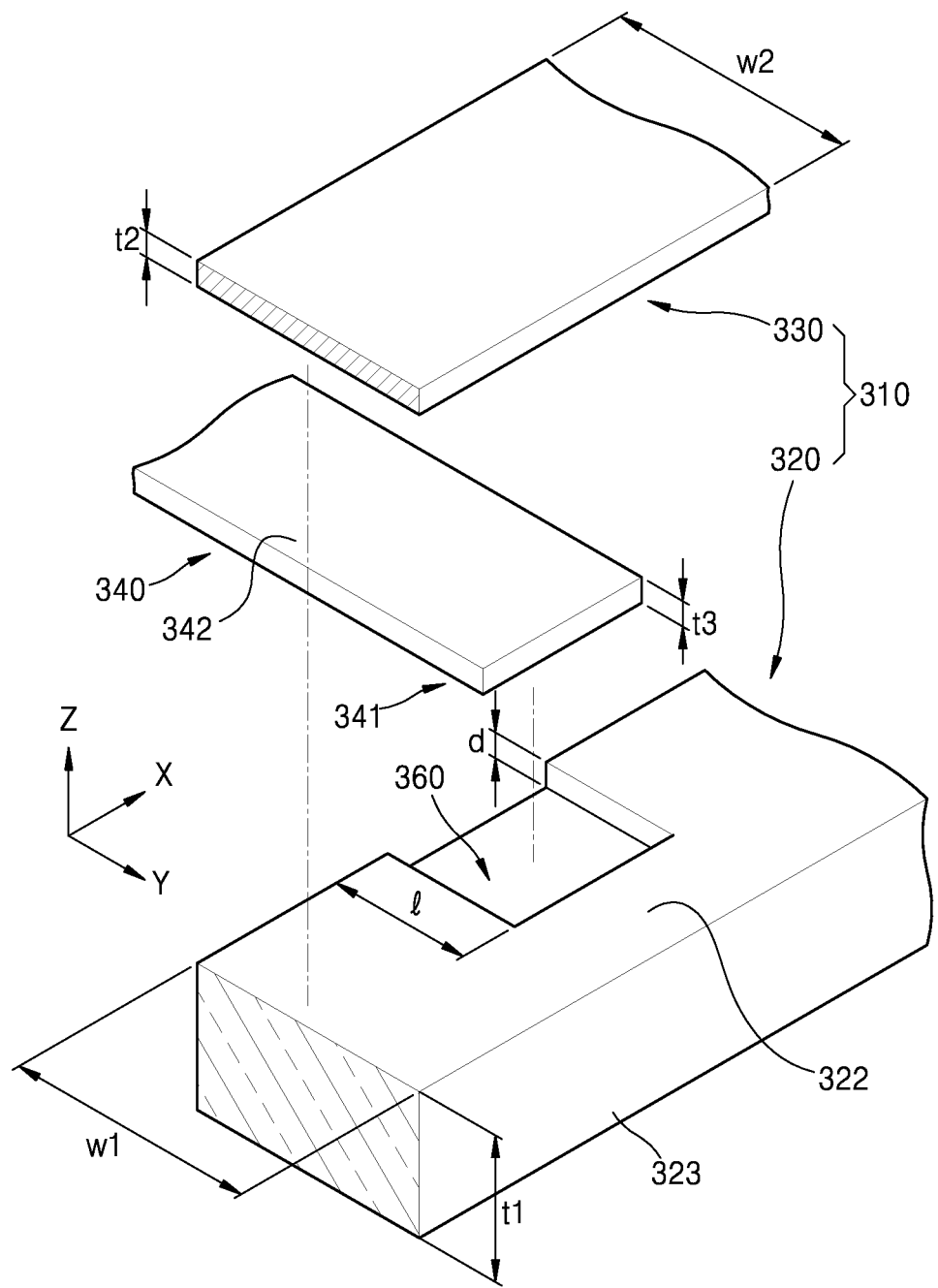
FIG. 3A is a magnified exploded perspective view illustrating a cut-away portion A of FIG. 2.
Figure 3B:
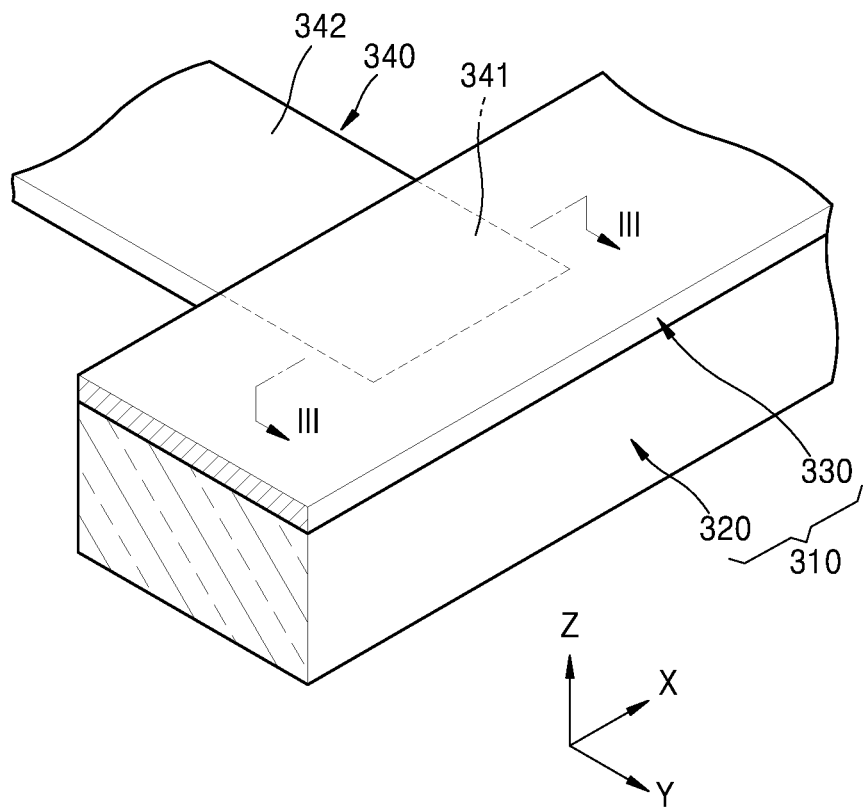
FIG. 3B is an assembled perspective view of the mask stick of FIG. 3A.
Figure 3C:
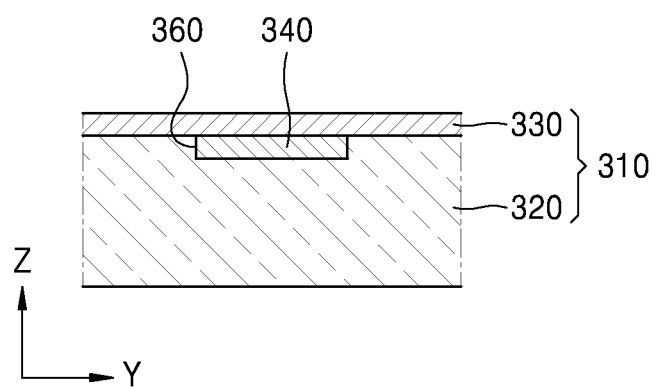
FIG. 3C is a cross-sectional view taken along line III-III of FIG. 3B.

FIG. 1 is an exploded perspective view of a mask frame assembly 100 according to an embodiment. FIG. 2 is a plan view of a mask stick 300 of FIG. 1. FIG. 3A is a magnified exploded perspective view illustrating a cut-away portion A of FIG. 2. FIG. 3B is an assembled perspective view of the mask stick 300 of FIG. 3A. FIG. 3C is a cross-sectional view taken along line III-III of FIG. 3B.

Referring to FIGS. 1, 2, and 3A to 3C, the mask frame assembly 100 includes a mask frame 200 and the mask stick 300 mounted on the mask frame 200.

An opening 201 may be arranged in the mask frame 200. The opening 201 may be surrounded by a plurality of first to fourth frames 210 to 240 included in the mask frame 200. The plurality of first to fourth frames 210 to 240 may be connected to each other.

The plurality of first to fourth frames 210 to 240 include the first frame 210 and the second frame 220 facing each other in a first direction (an X-direction), and the third frame 230 and the fourth frame 240 facing each other in a second direction (a Y-direction). The first frame 210, the second frame 220, the third frame 230, and the fourth frame 240 may be connected to each other to thereby constitute a rectangular frame. A mounting portion 250 in which the mask stick 300 is mounted may be arranged in the plurality of first to fourth frames 210 to 240. The mounting portion 250 may provide a lower step in which the mask stick 300 may be seated.

The mask frame 200 may be formed of a material which does not deform when the mask stick 300 is welded, for example, metal having great rigidity. In an embodiment, a thickness of the mask frame 200 may be about 50 mm.

The mask stick 300 may be provided on and combined with the mask frame 200. The mask stick 300 includes stainless steel, invar, nickel (Ni), cobalt (Co), a nickel alloy, a nickel-cobalt alloy, or the like.

The mask stick 300 includes a plurality of mask sticks. The mask stick 300 includes at least one first mask stick 310, at least one second mask stick 340, and a plurality of third mask sticks 370 (371, 372, 373 and 374). The mask stick 300 may be a hybrid-type mask stick through which a deposition material may be deposited on a plurality of unit display panels having different sizes at the same time.

The at least one first mask stick 310 may extend in the first direction (the X-direction). The first direction (the X-direction) may be a longitudinal direction of the at least one first mask stick 310.

The at least one second mask stick 340 may extend in the second direction (the Y-direction). The second direction (the Y-direction) may be a longitudinal direction of the at least one second mask stick 340. The second direction (the Y-direction) may be a direction crossing the first direction (the X direction). At least one second mask stick 340 may be present. In an embodiment, the at least one second mask stick 340 includes three sticks.

The plurality of third mask sticks 370 includes a first stick portion 371, a second stick portion 372 facing each other in the first direction (the X-direction) and extending in the second direction (the Y-direction), a third stick portion 373 and a fourth stick portion 374 facing each other in the second direction (the Y-direction) and extending in the first direction (the X-direction). The first stick portion 371, the second stick portion 372, the third stick portion 373, and the fourth stick portion 374 may be connected to each other to thereby constitute a rectangular frame. The plurality of third mask sticks 370 may be mounted on the mounting portion 250 arranged in the plurality of first to fourth frames 210 to 240.

The at least one first mask stick 310, the at least one second mask stick 340, and the plurality of third mask sticks 370 may be connected to each other to thereby define a plurality of first to fifth deposition areas DA1, DA2, DA3, DA4, and DA5. Each of the plurality of first to fifth deposition areas DA1, DA2, DA3, DA4, and DA5 may be arranged in a space defined by the at least one first mask stick 310, the at least one second mask stick 340, and the plurality of third mask sticks 370 that are connected to each other.

A deposition area among the plurality of first to fifth deposition areas DA1, DA2, DA3, DA4, and DA5, for example, the first deposition area DA1 may correspond to an opening 301 for forming a common layer deposited over an adjacent pixel area patterned on a unit display panel, for example, a common electrode of the organic light-emitting diode (OLED) or some layers in an intermediate layer.

The plurality of first to fifth deposition areas DA1 to D5 may correspond to a plurality of unit display panels with a different size. For example, the first deposition area DA1, the second deposition area DA2, and the third deposition area DA3 may each correspond to a large unit display panel. The fourth deposition area DA4 and the fifth deposition area DA5 may each correspond to a small unit display panel.

The first deposition area DA1, the second deposition area DA2, and the third deposition area DA3 may have a same size. The fourth deposition area DA4 and the fifth deposition area DA5 may have a same size. A deposition material may pass through each opening 301 in the plurality of first to fifth deposition areas DA1 to DA5 to be thereby deposited on each unit display panel.

As such, the at least one first mask stick 310, the at least one second mask stick 340, and the plurality of third mask sticks 370 may be connected to each other to thereby define the plurality of first to fifth deposition areas DA1 to DA5 having a same or different size.

While a predetermined tensile force is applied to the at least one second mask stick 340 in the second direction (the Y-direction), both first and second ends 341 and 343 of the at least one second mask stick 340 may be welded to the at least one first mask stick 310 and at least one of the plurality of third mask sticks 370 respectively.

In an embodiment, the at least one first mask stick 310 may be longer than the at least one second mask stick 340. A plurality of the second mask sticks 340 may be spaced apart from each other in the first direction (the X-direction) and welded to the at least one first mask stick 310. When the plurality of second mask sticks 340 are welded to the at least one first mask stick 310, the at least one first mask stick 310 may be bent due to a tensile force transmitted from the plurality of second mask sticks 340. When the at least one first mask stick 310 is deformed, dimensions of the plurality of first to fifth deposition areas DA1 to DA5 may not be accurate.

To prevent deformation of the at least one first mask stick 310 and the plurality of second mask sticks 340 in an area in which the at least one first mask stick 310 is connected to the plurality of second mask sticks 340, the at least one first mask stick 310 includes a plurality of first and second sticks 320 and 330. The at least one first mask stick 310 includes the first stick 320 and the second stick 330 arranged on the first stick 320.

The first stick 320 and the second stick 330 may extend together in the first direction (the X-direction). The first stick 320 may overlap the second stick 330 in a third direction (a Z-direction) crossing the first direction (the X-direction) and the second direction (the Y-direction). The third direction (the Z-direction) may be a direction of a thickness (that is, a perpendicular direction) of the at least one first mask stick 310. The second stick 330 may overlap the first stick 320. A width w2 of the second stick 330 may be the same as or greater than a width w1 of the first stick 320.

A thickness t1 of the first stick 320 may be different from a thickness t2 of the second stick 330 and a thickness t3 of the at least one second mask stick 340. In detail, the thickness t1 of the first stick 320 may be greater than the thickness t2 of the second stick 330 and the thickness t3 of the at least one second mask stick 340. The thickness t2 of the second stick may be the same as the thickness t3 of the at least one second mask stick 340.

The thickness t1 of the first stick may be hundreds or more times greater than the thickness t3 of the second stick 330. For example, the first stick 320 has a thick bar-type shape, and the second stick 330 may have a thin sheet-type shape. In an embodiment, the thickness t1 of the first stick 320 may be about 5 to about 10 mm. The thickness t2 of the second stick 330 and the thickness t3 of the at least one second mask stick 340 may be about 20 to about 50 micrometers.

The at least one second mask stick 340 may be welded onto the first stick 320. When the at least one second mask stick 340 is welded onto the first stick 320 while applying a tensile force, since the thickness t1 of the first stick 320 is comparatively greater than the thickness t3 of the at least one second mask stick 340, deformation of the first stick 320 may be prevented.

Both ends 321 of the first stick 320 may be inserted into an insertion groove 260 in the first frame 210 and the second frame 220. The first stick 320 may be fixed to the first frame 210 and the second frame 220 by using a bolt tightening method, a welding method, or the like.

The at least one second mask stick 340 may be welded onto the first stick 320. The second stick 330 may be welded onto the at least one second mask stick 340. If the height difference occurs between the at least one first mask stick 310 and the at least one second mask stick 340, a shadow may occur in the plurality of first to fifth deposition areas DA1 to DA5 of FIG. 2 in a plurality of unit display devices in a deposition process. To prevent occurrence of the shadow, a partially-recessed portion 360 may be provided in a portion in which the at least one first mask stick 310 is connected to the at least one second mask stick 340. The partially-recessed portion 360 may be provided in either the first stick 320 or the second stick 330.

In detail, the partially-recessed portion 360 may be provided in the first stick 320. The partially-recessed portion 360 may correspond to a portion of the first stick 320 with a thickness less than the thickness t1 of another portion of the first stick 320. The partially-recessed portion 360 may be an area in which the first stick 320 is recessed from a surface 322 of the first stick 320 in the third direction (the Z-direction). The third direction (the Z-direction) may be a direction perpendicular to the first stick 320.

A first end 341 of the at least one second mask stick 340 may be mounted into the partially-recessed portion 360. A depth d of the partially-recessed portion 360 may be the same as the thickness t3 of the at least one second mask stick 340. Since the first end 341 of the at least one second mask stick 340 is mounted into the partially-recessed portion 360, a height difference may not occur between the first stick 320 and the at least one second mask stick 340. That is, the surface 322 of the first stick 320 may be on a same horizontal plane as a surface 342 of the at least one second mask stick 340.

The first stick 320 may be connected to the at least one second mask stick 340 by performing laser welding. In detail, while a predetermined tensile force is applied to the at least one second mask stick 340 in the second direction (the Y-direction), the first end 341 of the at least one second mask stick 340 may be mounted into the partially-recessed portion 360. Then, a welding process is performed by emitting a laser beam from an upper portion of the at least one second mask stick 340.

A length € of the partially-recessed portion 360 shown in FIG. 3A may be less than the width w1 of the first stick 320 in the second direction (the Y-direction). Accordingly, the first end 341 of the at least one second mask stick 340 mounted in the partially-recessed portion 360 may not extend to an outer edge 323 of the first stick 320. For example, the first end 341 of the at least one second mask stick 340 may be arranged at a central portion of the first stick 320. The second end 343 of the at least one second mask stick 340 may be inserted into insertion grooves 270 in the third frame 230 and the fourth frame 240.

Because the third mask stick 370 is welded to the plurality of first to fourth frames 210 to 240 having great rigidity, a portion in which the at least one first mask stick 310 and/or the at least one second mask stick 340 are connected to the plurality of first to fourth frames 210 to 240 may not be deformed.

A shape or a structure of the plurality of third mask sticks 370 may be variously deformed according to end shapes or structures of the at least one first mask stick 310 and the at least one second mask stick 340. For example, as long as a surface of the plurality of third mask sticks 370 in contact with a substrate is on a same horizontal plane as an uppermost surface of the at least one first mask stick 310, a surface or a structure of the plurality of third mask sticks 370 is not limited.

Hereinafter, according to an embodiment, characteristics of a portion in which a first mask stick is connected to a second mask stick is described. As described above, because a design of a third mask stick may be altered according to a structure in which the first mask stick is combined with the second mask stick, the third mask stick is not described here, wherein the third mask stick is connected to the first mask stick and the second mask stick to thereby define a plurality of deposition areas.

Figure 4A:
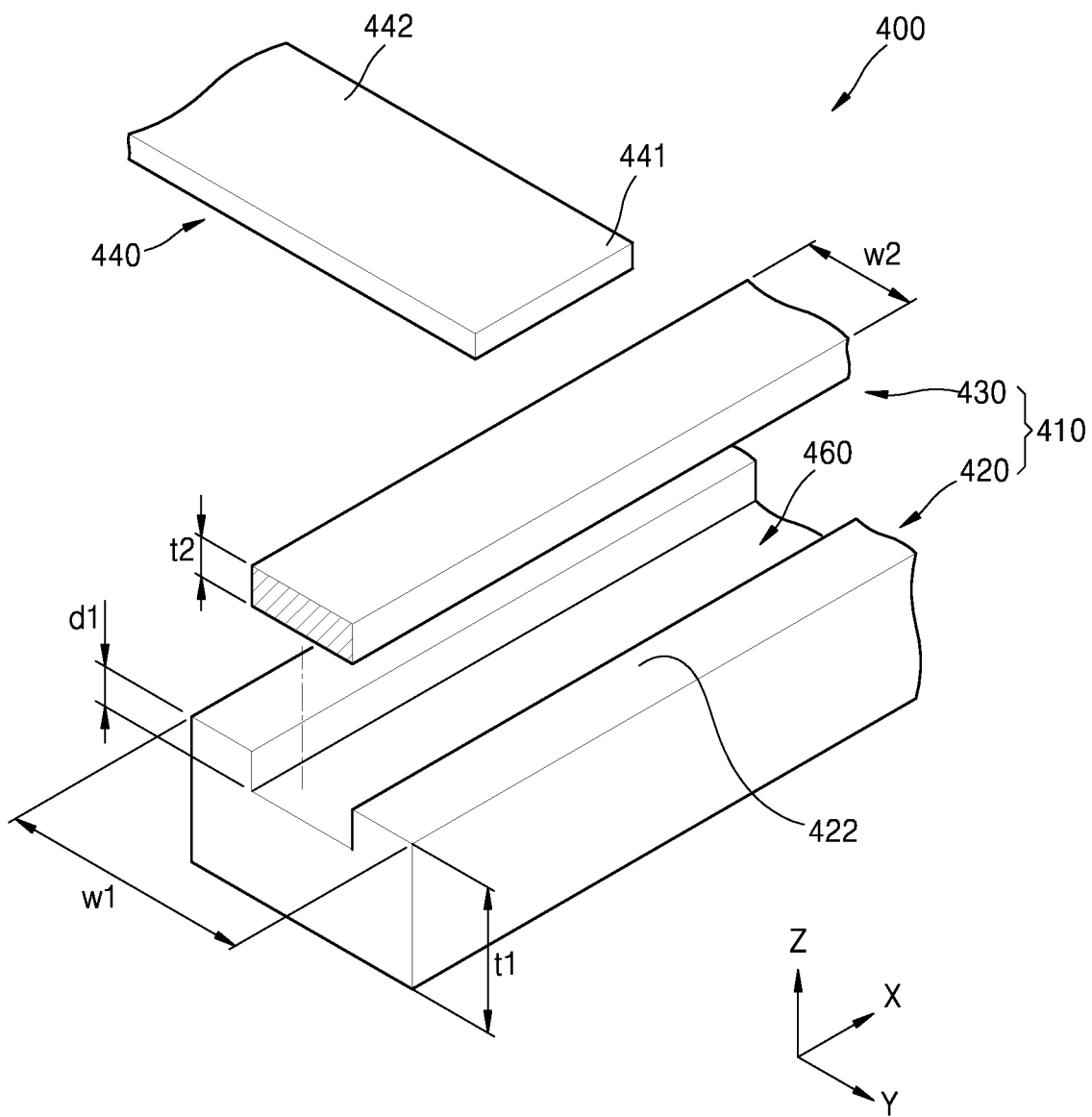
FIG. 4A is a magnified exploded perspective view of a portion of a mask stick according to another embodiment.
Figure 4B:
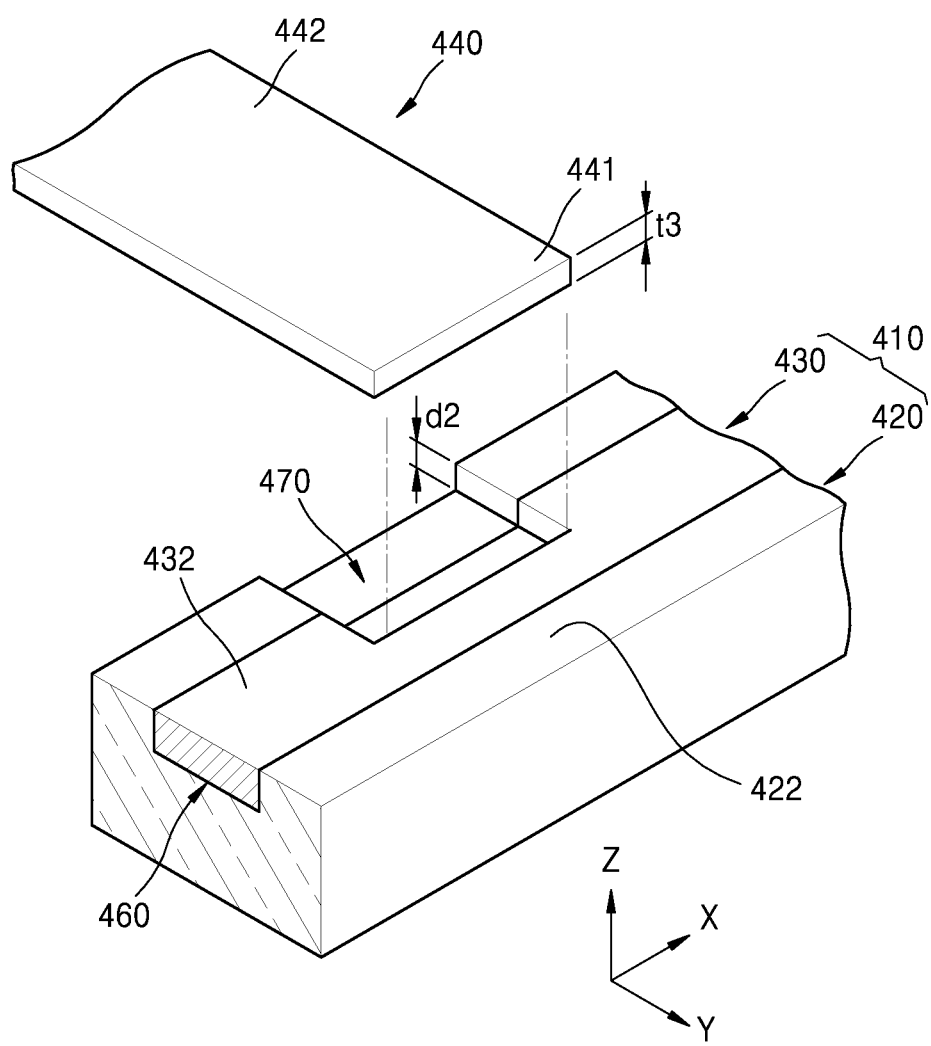
FIG. 4B is an exploded perspective view illustrating a state in which a first stick of FIG. 4A is combined with a second stick of FIG. 4A.
Figure 4C:
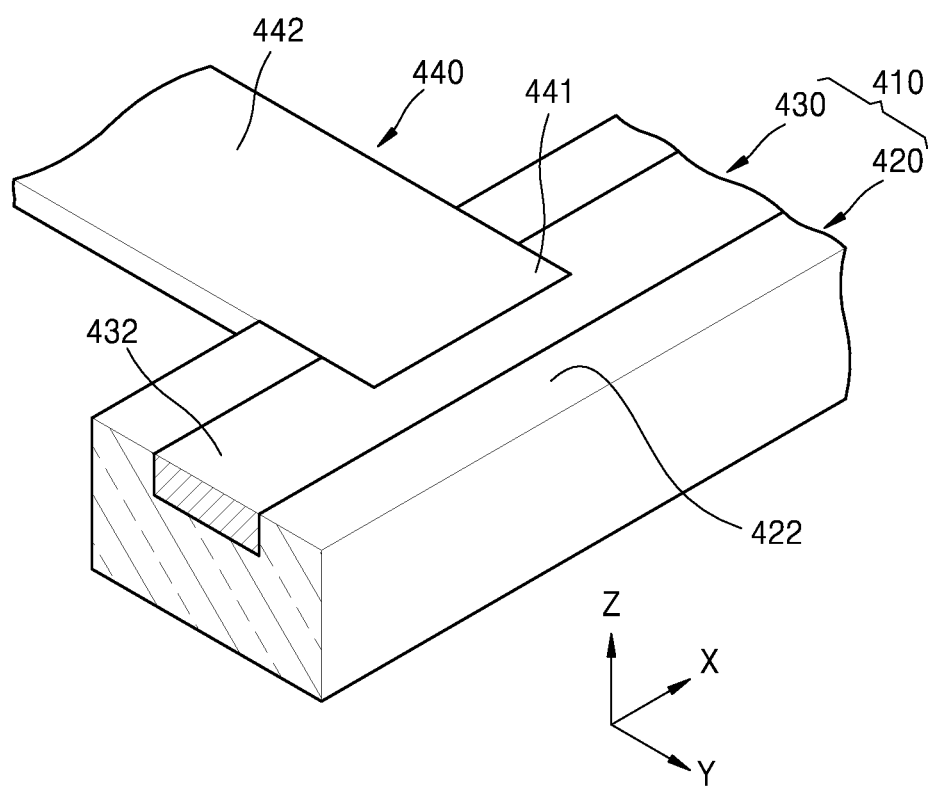
FIG. 4C is a perspective view illustrating a state in which a second mask stick of FIG. 4A is provided on and combined with a first mask stick of FIG. 4A.

FIG. 4A is a magnified exploded perspective view illustrating a portion of a mask stick 400 according to another embodiment. FIG. 4B is an exploded perspective view illustrating a state in which a first stick 420 of FIG. 4A is combined with a second stick 430 of FIG. 4A. FIG. 4C is a perspective view illustrating a state in which a second mask stick 440 of FIG. 4A is provided on and combined with a first mask stick 410 of FIG. 4A.

Referring to FIGS. 4A, 4B, and 4C, the mask stick 400 includes the first mask stick 410 and the second mask stick 440. Each of the first mask stick 410 and the second mask stick 440 may be connected to the plurality of third mask sticks 370 of FIG. 2 to thereby define the plurality of first to fifth deposition areas DA1 to DA5.

The first mask stick 410 includes a first and second sticks 420 and 430. The first mask stick 410 includes the first stick 420 and the second stick 430 arranged on the first stick 420. The first stick 420 and the second stick 430 may extend together in the first direction (the X-direction). The first stick 420 may completely overlap the second stick 430. The width w2 of the second stick 430 may be less than the width w1 of the first stick 420. The thickness t1 of the first stick 420 may be different from the thickness t2 of the second stick 430. In detail, the thickness t1 of the first stick 420 may be greater than the thickness t2 of the second stick 430.

The first stick 420 may be welded to the mask frame 200 of FIG. 1 while applying a tensile force to the first stick 420 in the first direction (the X-direction). The second stick 430 may be welded onto the first stick 420 while applying a tensile force to the second stick 430 in the first direction (the X-direction). In an embodiment, the second stick 430 may be welded to the mask frame 200 while applying a tensile force.

The second mask stick 440 may be welded onto the second stick 430 while applying a tensile force. When the second mask stick 440 is be welded onto the second stick 430 while applying a tensile force, a height difference may occur between the first stick 420, the second stick 430, and the second mask stick 440. To remove the height difference, first and second partially-recessed portions 460 and 470 may be arranged in a portion in which the first stick 420, the second stick 430, and the second mask stick 440 are connected to each other.

In detail, the second stick 430 may be arranged in the first partially-recessed portion 460. The first partially-recessed portion 460 may correspond to a portion of the first stick 420 with a thickness less than a thickness of another portion of the first stick 420. The second stick 430 may be mounted into the first partially-recessed portion 460.

The first partially-recessed portion 460 may be an area in which the first stick 420 is recessed from a surface 422 of the first stick 420 in the third direction (the Z-direction). The first partially-recessed portion 460 may extend in a longitudinal direction of the first mask stick 410 (the X-direction).

The depth d1 of the first partially-recessed portion 460 may be the same as the thickness t2 of the second stick 430. Since the second stick 430 is mounted into the first partially-recessed portion 460, a height difference may not occur between a surface of the first stick 420 and a surface of the second stick 430. The surface 422 of the first stick 420 may be on a same horizontal plane as a surface 432 of the second stick 430. When a predetermined tensile force is applied to the second stick 430 in the first direction (the X-direction), the second stick 430 may be welded onto the first stick 420.

The second mask stick 440 may be mounted into the second partially-recessed portion 470 of the first stick 420 and the second stick 430. In detail, after the second stick 430 is mounted into the first partially-recessed portion 460, the second partially-recessed portion 470 may be formed in a portion of the first stick 420 and the second stick 430 in which the second mask stick 440 is mounted. The second partially-recessed portion 470 may be formed in both of the first stick 420 and the second stick 430, each corresponding to a portion in which an end 441 of the second mask stick 440 is mounted.

The second partially-recessed portion 470 may be an area in which the first stick 420 and the second stick 430 are recessed in the third direction (the Z-direction). The second partially-recessed portion 470 may extend in the second direction (the Y-direction) that is a direction of a width of the first mask stick 410. The second partially-recessed portion 470 may correspond to portions of the first stick 420 and the second stick 430 with a thickness less than thicknesses of other portions of the first stick 420 and the second stick 430. The first stick 420 and the second stick 430 may be recessed to a same depth. The end 441 of the second mask stick 440 may be mounted into the second partially-recessed portion 470.

A depth d2 of the second partially-recessed portion 470 may be same as the thickness t3 of the second mask stick 440. Since the end 441 of the second mask stick 440 is mounted into the second partially-recessed portion 470, a height difference may not occur between the first stick 420, the second stick 430, and the second mask stick 440. That is, the surface 422 of the first stick 420, the surface 432 of the second stick 430, and a surface 442 of the second mask stick 440 may be on a same horizontal plane.

While a predetermined tensile force is applied to the second mask stick 440 in the second direction (the Y-direction), the end 441 of the second mask stick 440 may be mounted into the second partially-recessed portion 470. Then, a welding process is performed by emitting a laser beam from an upper portion of the second mask stick 440. The second mask stick 440 may be welded onto the second stick 430 while applying a tensile force.

Figure 5A:
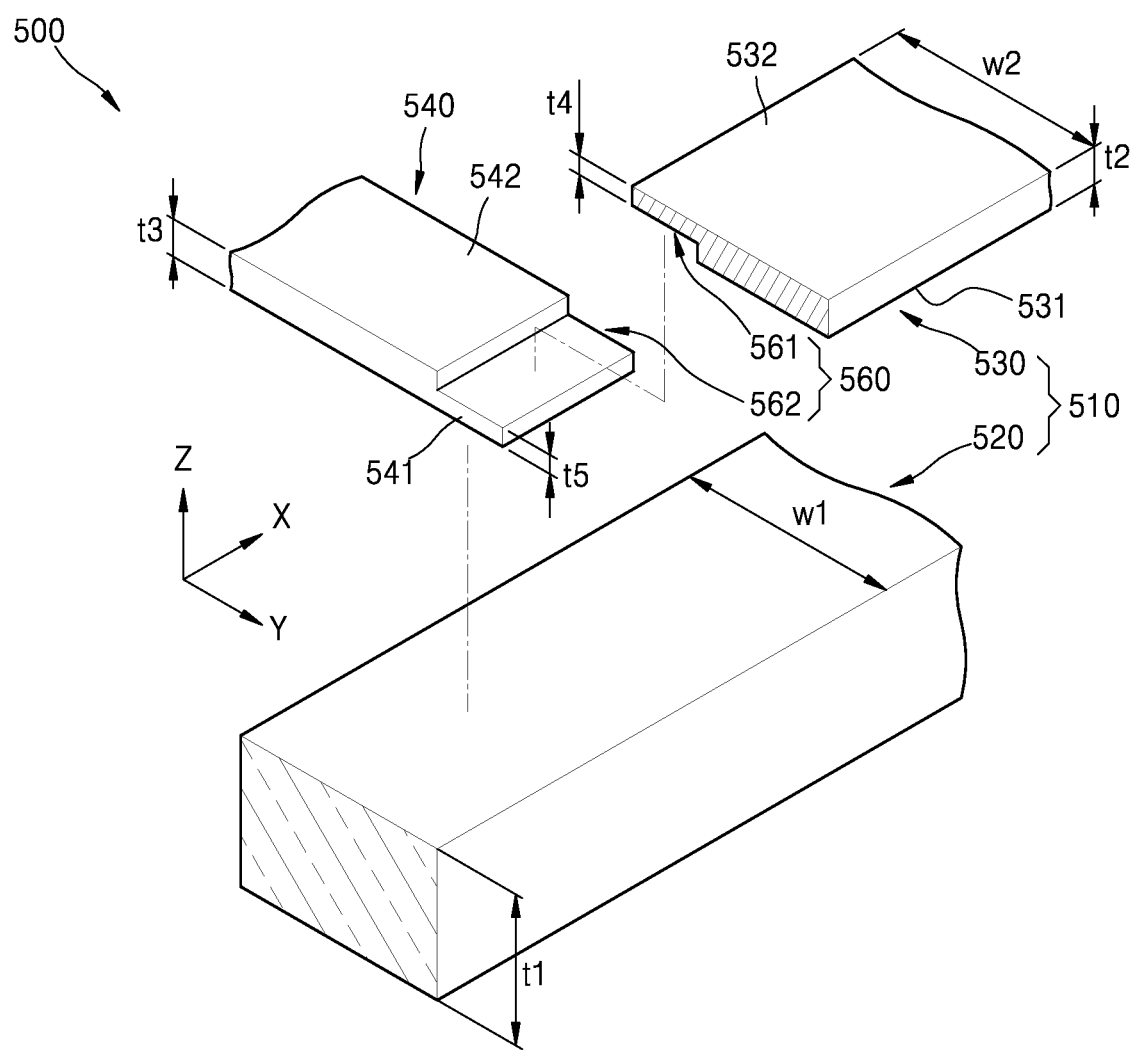
FIG. 5A is a magnified exploded perspective view illustrating a cut-away portion of a mask stick according to another embodiment.
Figure 5B:
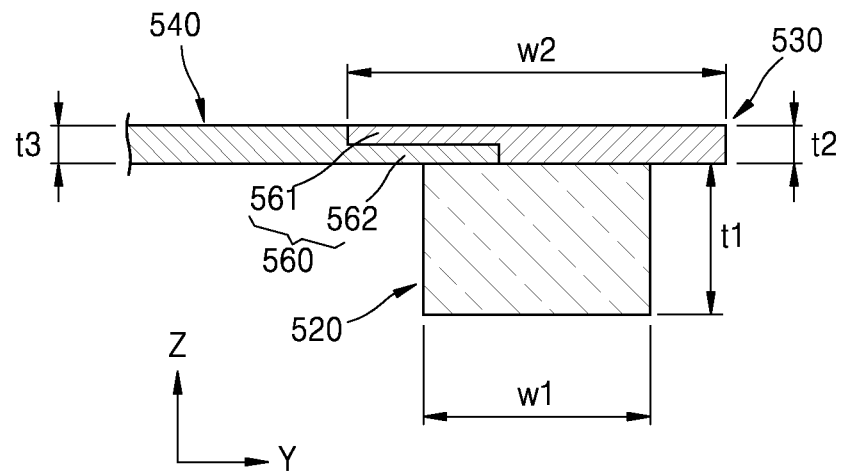
FIG. 5B is a cross-sectional view illustrating an assembled state of the mask stick of FIG. 5A.
Figure 5C:
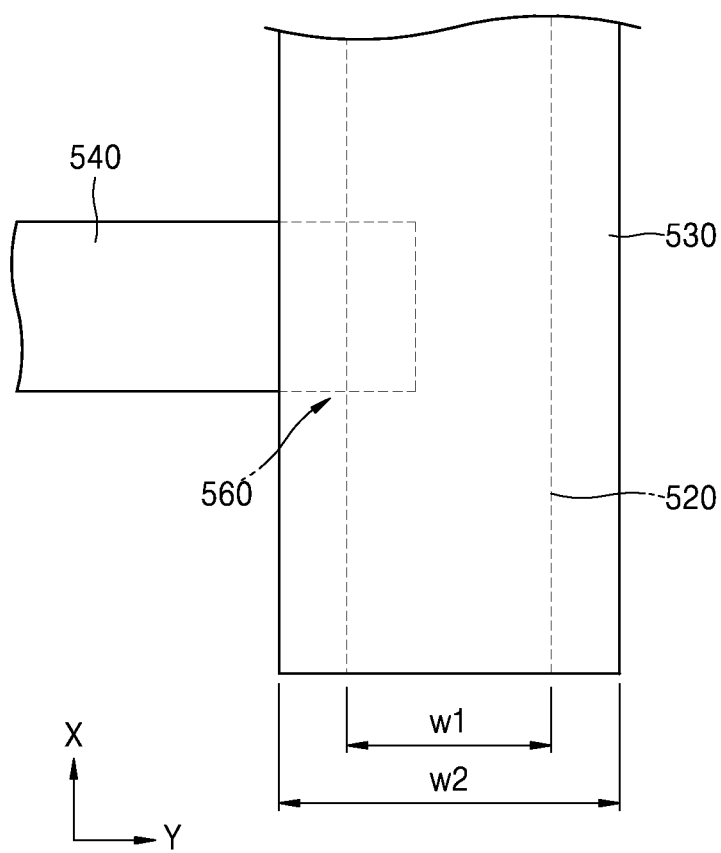
FIG. 5C is a plan view illustrating an assembled state of the mask stick of FIG. 5A.

FIG. 5A is a magnified exploded perspective view illustrating a cut-away portion of a mask stick 500 according to another embodiment. FIG. 5B is a cross-sectional view illustrating an assembled state of the mask stick 500 of FIG. 5A. FIG. 5C is a plan view illustrating an assembled state of the mask stick of FIG. 5A.

Referring to FIGS. 5A, 5B, and 5C, the mask stick 500 includes a first mask stick 510 and a second mask stick 540. The first mask stick 510 includes a first stick 520 and a second stick 530 arranged on the first stick 520. The first stick 520 and the second stick 530 may extend in the in the first direction (the X-direction). The first stick 520 may be a stick connected to the second mask stick 540. The second stick 530 may be a stick defining the plurality of first to fifth deposition areas (DA1 to DA5 of FIG. 2).

The first stick 520 may overlap the second stick 530 in the third direction (the Z-direction). The thickness t1 of the first stick 520 may be different from the thickness t2 of the second stick 530. For example, the thickness t1 of the first stick 520 may be greater than the thickness t2 of the second stick 530. The thickness t2 of the second stick 530 may be the same as the thickness t3 of the second mask stick 540.

The second mask stick 540 may be welded to the first stick 520 having a great thickness. Since the thickness t1 of the first stick 520 is greater than the thickness t2 of the second stick 530, when the second mask stick 540 is welded to the first stick 520 while applying a tensile force, deformation of the first stick 520 may be minimized.

The second mask stick 540 may be welded onto the first stick 520 while applying a tensile force, and the second stick 530 may be welded to the second mask stick 540 while applying a tensile force. When a height difference occurs between the second stick 530 and the second mask stick 540, a shadow may occur in the plurality of first to fifth deposition areas DA1 to DA5 of the plurality of unit display panels.

To prevent occurrence of the shadow, a partially-recessed portion 560 may be arranged in a portion in which the second stick 530 is connected to the second mask stick 540. In detail, the partially-recessed portion 560 includes a first partially-recessed portion 561 on the second stick 530, and a second partially-recessed portion 562 on the second mask stick 540.

The first partially-recessed portion 561 may be arranged in a portion corresponding to the second stick 530 in which a first end 541 of the second mask stick 540 is mounted. The first partially-recessed portion 561 may correspond to a portion of the first partially-recessed portion 561 with a thickness t4 less than the thickness t2 of another portion of the second stick 530. For example, the first partially-recessed portion 561 may correspond to a portion of the second stick 530 with the thickness t4 less than a thickness of another portion of the second stick 530 in the third direction (the Z-direction) perpendicular to a lower surface 531 of the second stick 530 facing the first stick 520.

The second partially-recessed portion 562 may be arranged at the first end 541 of the second mask stick 540. The second partially-recessed portion 562 may correspond to a portion of the second mask stick 540 with a thickness t5 less than the thickness t3 of another portion of the second mask stick 540. For example, the second partially-recessed portion 562 may correspond to a portion of the second mask stick 540 with the thickness t5 less than a thickness of another portion of the second mask stick 540 in the third direction (the Z-direction) perpendicular to an upper surface 542 of the second mask stick 540.

The first partially-recessed portion 561 may have a shape corresponding to that of the second partially-recessed portion 562. The first partially-recessed portion 561 may be combined with the second partially-recessed portion 562 in the third direction (the Z-direction). The sum of thicknesses t4 and t5 of portions where the first partially-recessed portion 561 is combined with the second partially-recessed portion 562 may be equal to the thickness t2 of another portion of the second stick 530 that does not include the first partially-recessed portion 561 and/or the thickness t3 of another portion of the second mask stick 540 that does not include the second partially-recessed portion 562. Since the second stick 530 is connected to the second mask stick 540 in a portion in which the partially-recessed portion 560 is arranged, a height difference does not occur between the second stick 530 and the second mask stick 540.

A substrate (not shown) may contact an upper surface 532 of the second stick 530 and the upper surface 542 of the second mask stick 540. The width w2 of the second stick 530 defining the plurality of first to fifth deposition areas DA1 to DA5 may be greater than the width w1 of the first stick 520 connected to the second mask stick 540.

As such, the thickness t1 of the first stick 520 may be greater than the thickness t2 of the second stick 530, and the width w1 of the first stick 520 may be less than the width w2 of the second stick 530. Accordingly, even when the first stick is twisted to left or right, since the width w1 of the first stick 520 is less than the width w2 of the second stick 530 defining a deposition area, a sufficient margin may be ensured for the first stick 520. Resultantly, a shadow phenomenon may be prevented.

Figure 6:
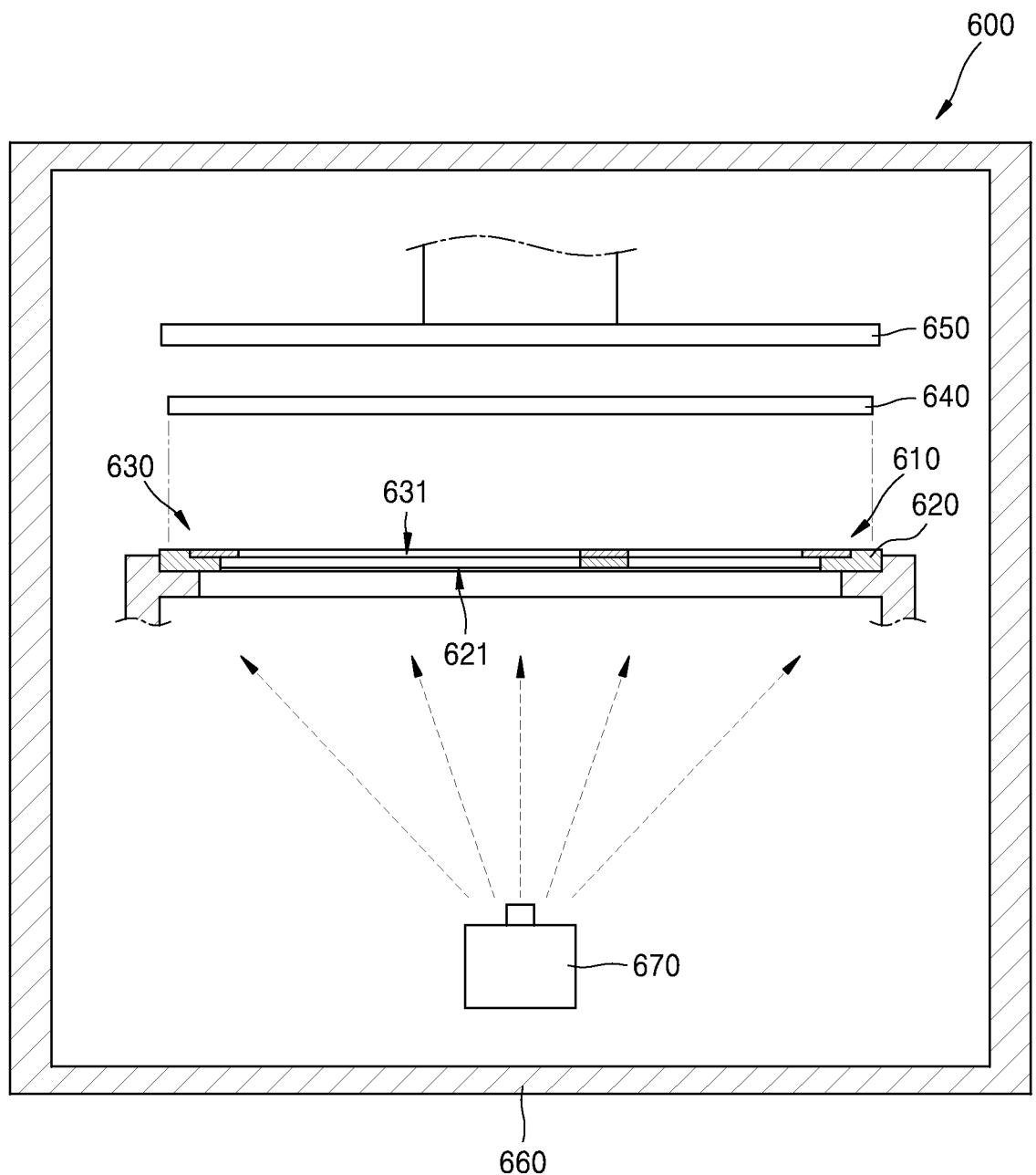
FIG. 6 is a configuration diagram of a deposition apparatus according to an embodiment.

FIG. 6 is a configuration diagram of a deposition device 600 according to an embodiment.

Referring to the drawing, a vacuum chamber 660 is arranged in the deposition device 600 wherein the vacuum chamber 660 is configured to deposit a cathode of an organic light-emitting display device, or a common layer like some layers in an intermediate layer.

A deposition source 670 may be arranged in a lower portion of the vacuum chamber 660. A mask frame assembly 610 may be installed on the deposition source 670. A mask stick 630 may be installed on a mask frame 620. A plurality of openings 631 may be arranged on the mask stick 630 wherein the plurality of openings 631 correspond to a plurality of deposition areas for manufacturing a plurality of unit display devices at the same time. A substrate 640 for deposition may be arranged on the mask stick 630 on the opposite side of the deposition source 670 with respect to the mask frame assembly 610. A magnet 650 generating a magnetic force may be installed on the substrate 640 for deposition so that the mask stick 630 is adhered to the substrate 640 for deposition.

When a deposition material is sprayed from the deposition source 670 toward the mask stick 630, the deposition material proceeds via an opening 621 of the mask frame 620 and passes through the plurality of openings 631 of the mask stick 630 thereby deposited on a surface of the substrate 640 for deposition.

Figure 7:
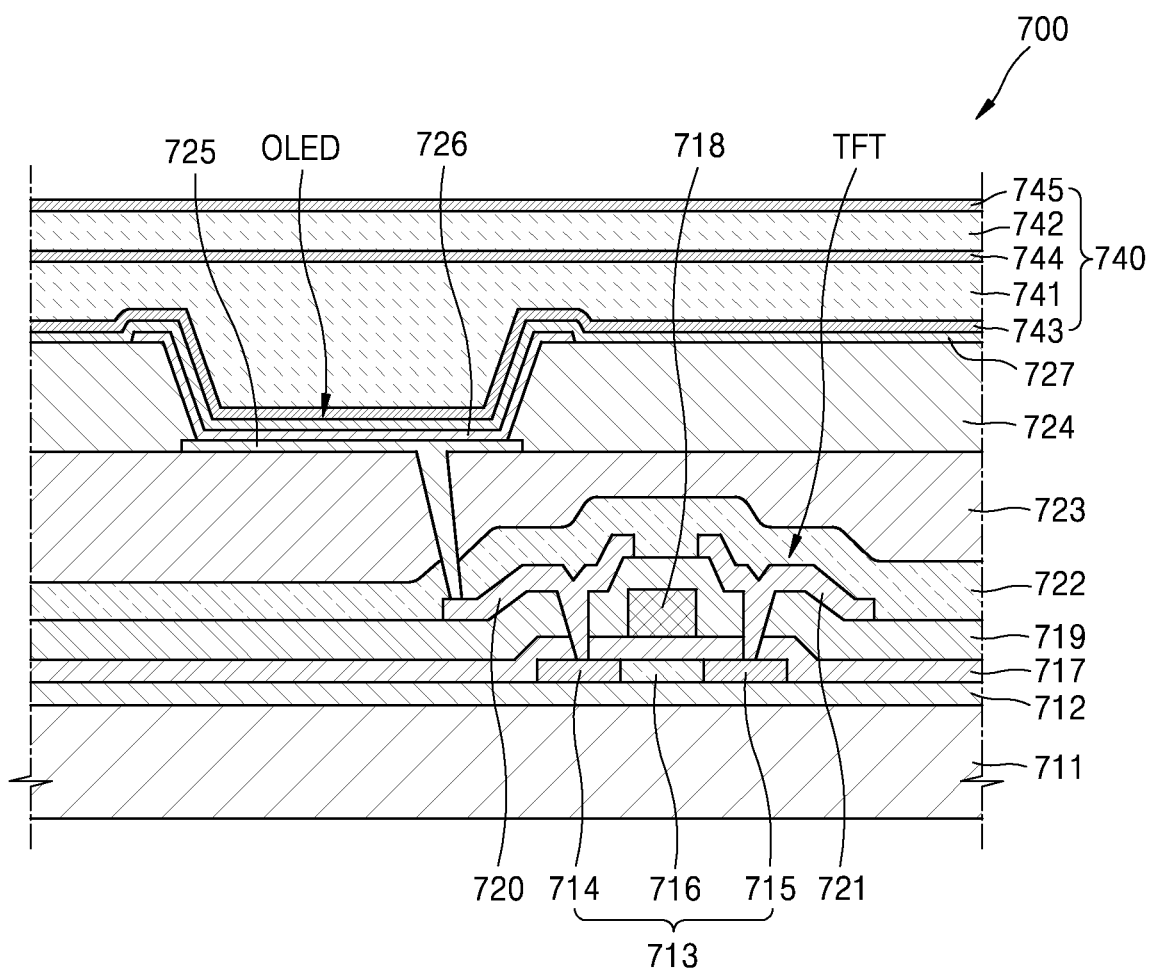
FIG. 7 is a cross-sectional view of a sub-pixel of an organic light-emitting display device according to an embodiment.

FIG. 7 is a cross-sectional view of a sub-pixel of an organic light-emitting display device 700 according to an embodiment.

Here, sub-pixels include at least one thin-film transistor TFT, and an organic light-emitting diode OLED. The at least one thin-film transistor TFT is not limited to a structure of FIG. 7, and a number and a structure thereof may be variously modified.

Referring to the drawing, a substrate 711 is arranged on the organic light-emitting display device 700. The substrate 711 includes a glass substrate, a plastic substrate, or a film substrate having flexibility. The substrate 711 may be transparent, translucent, or opaque.

A barrier layer 712 may be arranged on the substrate 711. The barrier layer 712 may cover an upper surface of the substrate 711. The barrier layer 712 may be formed of an inorganic layer or an organic layer. The barrier layer 712 may be a single layer or multiple layers.

The at least one thin-film transistor TFT may be arranged over the barrier layer 712. According to the present embodiment, a top-gate type TFT is included as an example. However, at least one thin-film transistor TFT with another structure like a bottom-gate type TFT may be included.

A semiconductor layer 713 may be arranged on the barrier layer 712. A source area 714 and a drain area 715 may be formed in the semiconductor layer 713 by doping an N-type or P-type impurity ion. An area between the source area 714 and the drain area 715 may be a channel area 716 in which an impurity is not doped.

The semiconductor layer 713 may be an organic semiconductor layer, an inorganic semiconductor layer, or a layer including amorphous silicon. In another embodiment, the semiconductor layer 713 may be an oxide semiconductor layer.

A gate insulating layer 717 may be deposited on the semiconductor layer 713. The gate insulating layer 717 may be formed of an inorganic layer. The gate insulating layer 717 may be a single layer or multiple layers.

A gate electrode 718 may be arranged on the gate insulating layer 717. The gate electrode 718 includes a single layer or multiple layers including gold (Au), silver (Ag), copper (Cu), nickel (Ni), platinum (Pt), palladium (Pd), aluminum (Al), molybdenum (Mo), chrome (Cr), or the like, or includes an alloy like an aluminum-neodymium (Al:Nd) alloy, or a molybdenum tungsten (Mo:W) alloy.

An interlayer insulating layer 719 may be arranged on the gate electrode 718. The interlayer insulating layer 719 may be formed of an inorganic layer including silicon oxide, silicon nitride, etc.

A source electrode 720 and a drain electrode 721 may be arranged on the interlayer insulating layer 719. A contact hole may be formed by removing a part of the gate insulating layer 717 and a part of the interlayer insulating layer 719. Then, via the contact hole, the source electrode 720 may be electrically connected to the source area 714 and the drain electrode 721 may be electrically connected to the drain area 715.

A passivation layer 722 may be arranged on the source electrode 720 and the drain electrode 721. The passivation layer 722 may be formed of an inorganic layer or an organic layer.

A planarization layer 723 may be arranged on the passivation layer 722. The planarization layer 723 includes an organic layer including acryl, polyimide, benzocyclobutene (BCB), or the like.

The organic light-emitting diode OLED may be arranged on the at least one thin-film transistor TFT.

The organic light-emitting diode OLED includes a first electrode 725, a second electrode 727, and an intermediate layer 726 disposed therebetween.

The first electrode 725 is connected either the source electrode 720 or the drain electrode 721 via the contact hole. The first electrode 725 may correspond to a pixel electrode.

The first electrode 725 functions as an anode and may be formed of various types of conductive material. The first electrode 725 may be formed of a transparent electrode or a reflective electrode.

On the planarization layer 723, a pixel-defining layer (PDL) 724 covering an edge of the first electrode 725 of the organic light-emitting OLED may be arranged. The pixel-defining layer 724 defines a light-emitting area of each sub-pixel by surrounding the edge of the first electrode 725. The pixel-defining layer 724 may be formed of an organic layer. The pixel-defining layer 724 may have an opening exposing the first electrode 725.

On the first electrode 725, the intermediate layer 726 may be arranged in an area exposed by the pixel defining layer 724. The intermediate layer 726 may be formed by performing a deposition process.

The intermediate layer 726 may include a low-molecular weight organic material or a polymer organic material.

The intermediate layer 726 may include an organic emissive layer (EML). In another example, the intermediate layer 726 includes the organic emissive layer EML, and may further include at least one of a hole injection layer (HIL), a hole transport layer (HTL), an electron transport layer (ETL), and an electron injection layer (EIL), However, the present embodiment is not limited thereto, and the intermediate layer 726 may include an organic emissive layer, and may further include other various functional layers.

In an embodiment, the organic emissive layer EML may be arranged in each sub-pixel. The HIL, the HTL, the ETL, and the EIL function as a common layer, and may extend over an adjacent pixel. The HIL, the HTL, the ETL, and the EIL may be deposited by using a hybrid-type mask stick according to an embodiment.

The second electrode 727 may be arranged on the intermediate layer 726. The second electrode 727 may correspond to a common electrode. Like the first electrode 725, the second electrode 727 may be formed of a transparent electrode or a reflective electrode. The second electrode 727 may be deposited by using a hybrid-type mask stick according to an embodiment.

The first electrode may be insulated from the second electrode 727 by using the intermediate layer 726. When a voltage is applied to the first electrode 725 and the second electrode 727, visible light may be emitted from the intermediate layer 726 to thereby display an image that may be recognized by a user.

An encapsulation layer 740 may be arranged on the organic light-emitting OLED.

In the encapsulation layer 740, a plurality of organic layers 741 and 742 and a plurality of inorganic layers 743 to 745 may be alternately stacked. In an embodiment, the encapsulation layer 740 may have a structure in which the plurality of organic layers 741 and 742 constitute at least one layer and the plurality of inorganic layers 743 to 745 constitute at least two layers. In the encapsulation layer 740, an uppermost layer 745 exposed to outside may be formed of an inorganic layer to prevent intrusion of moisture into the organic light-emitting diode OLED.

According to an embodiment, in a hybrid-type mask stick and a mask frame assembly applying the same, deformation of a portion in which a plurality of mask sticks are connected to each other may be prevented. Accordingly, deposition areas partitioned by the plurality of mask sticks may be accurately defined.

An effect of the present disclosure may be derived from a description provided herein with reference to drawings, as well as the description provided above.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A mask frame assembly comprising:
a mask frame comprising an opening; and
a mask stick arranged on the mask frame and comprising:
at least one first mask stick extending in a first direction,
at least one second mask stick extending in a second direction crossing the first direction, and
a plurality of third mask sticks connected to respective ends of the at least one first mask stick and the at least one second mask stick, the at least one first mask stick, the at least one second mask stick and the plurality of third mask sticks defining a plurality of deposition areas,
wherein the at least one first mask stick comprises a first stick and a second stick arranged on the first stick,
wherein the first stick includes a partially-recessed portion into which the at least one second mask stick is mounted,
wherein a thickness of the first stick is greater than a thickness of the second stick,
wherein the at least one first mask stick has a thickness greater than that of the at least one second mask stick, the thickness being a length along a third direction perpendicular to a plane formed by the first direction and the second direction,
wherein the first stick is more than 100 times thicker than the second stick, and
wherein the mask frame further includes a mounting portion surrounding the opening and recessed from a top surface of the mask frame, and insertion grooves which are recessed from the mounting portion.

2. The mask frame assembly of claim 1, wherein the first stick and the second stick extend together in the first direction and overlap each other.

3. The mask frame assembly of claim 2, wherein a width of the second stick is less than a width of the first stick.

4. The mask frame assembly of claim 3, wherein the partially-recessed portion comprises: a first partially-recessed portion provided in the first stick and extending in the first direction and a second partially-recessed portion provided in both of the first stick and the second stick and extending in the second direction, and
wherein the second stick is mounted in the first partially-recessed portion and the at least one second mask stick is mounted in the second partially-recessed portion.

5. The mask frame assembly of claim 4, wherein a depth of the first partially-recessed portion is the same as the thickness of the second stick,
wherein a depth of the second partially-recessed portion is the same as a thickness of the at least one second mask stick, and
wherein a surface of the first stick, a surface of the second stick, and a surface of a second mask stick are on a same horizontal plane.

6. The mask frame assembly of claim 4, wherein the at least one second mask stick is welded onto the second stick while applying a tensile force.

7. The mask frame assembly of claim 2, wherein the partially-recessed portion comprises a first partially-recessed portion provided in the second stick, wherein a second partially-recessed portion is provided in the at least one second mask stick, wherein the second partially-recessed portion has a shape corresponding to the first partially-recessed portion, and wherein the first partially-recessed portion is combined with the second partially-recessed portion.

8. The mask frame assembly of claim 7, wherein a total thickness of a portion where the first partially-recessed portion is connected to the second partially-recessed portion is the same as a thickness of the other portion of the second stick.

9. The mask frame assembly of claim 7, wherein the at least one second mask stick is welded onto the first stick while applying a tensile force, and wherein the second stick is welded onto the at least one second mask stick while applying a tensile force.

10. The mask frame assembly of claim 1, wherein a depth of the partially-recessed portion is the same as a thickness of the at least one second mask stick, and wherein a surface of the first stick is on a same horizontal plane as a surface of the at least one second mask stick mounted in the partially-recessed portion.

11. The mask frame assembly of claim 1, wherein both ends of the at least one first mask stick are each connected to respective one of the plurality of third mask sticks.

12. The mask frame assembly of claim 1, wherein one deposition area among the plurality of deposition areas is correspond to an opening for a common layer deposited over an adjacent pixel area patterned on a unit display panel.

\* \* \* \* \*